(12) United States Patent
Lee et al.

(10) Patent No.: US 7,414,488 B2
(45) Date of Patent: Aug. 19, 2008

(54) LOW PHASE NOISE DIFFERENTIAL LC TANK VCO WITH CURRENT NEGATIVE FEEDBACK

(75) Inventors: Ja Yol Lee, Daejeon (KR); Sang Heung Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 75 days.

(21) Appl. No.: 11/518,233

(22) Filed: Sep. 11, 2006

(65) Prior Publication Data

US 2007/0132521 A1 Jun. 14, 2007

(30) Foreign Application Priority Data

Dec. 8, 2005 (KR) ............... 10-2005-0119425
Jul. 28, 2006 (KR) ............... 10-2006-0071106

(51) Int. Cl.
*H03B 5/04* (2006.01)
(52) U.S. Cl. .................. 331/167; 331/117 R
(58) Field of Classification Search ........... 331/117 R, 331/167
See application file for complete search history.

(56) References Cited

U.S. PATENT DOCUMENTS 4,169,248 A * 9/1979 Hongu et al. ............ 331/45

(Continued)

FOREIGN PATENT DOCUMENTS

KR  2020000018545  10/2000

(Continued)

OTHER PUBLICATIONS

Ja-Yol Lee et al.; "A Low-Phase Noise 5-GHz CCNF Colpitts VCO with Parallel Branch Inductors"; Proceedings of the 2005 Bipolar/BiCMOS Circuits and Technology Meeting; IEEE Catalog No. 05CH37709C; pp. 240-243.

(Continued)

*Primary Examiner*—Joseph Chang
(74) *Attorney, Agent, or Firm*—Lowe Hauptman Ham & Berner LLP

(57) ABSTRACT

A differential voltage controlled oscillator (VCO) employed in a frequency synthesizer used as a local oscillator of a wireless communication on-chip transmitter/receiver is provided. More particularly, a differential current negative feedback VCO equipped with a current-current negative feedback circuit that suppresses low- and high-frequency noise is provided.

A differential current negative feedback VCO includes a resonator determining oscillation frequency, and an oscillator generating negative resistance. In the oscillator of the differential current negative feedback VCO, transistors Q1 and Q2 form a cross-coupled pair, and negative resistance is generated by positive feedback of the cross-coupled pair. And, transistors Q1 and Q3 together with an emitter resistor and a capacitor form a current negative feedback part, and transistors Q2 and Q4 together with an emitter resistor and a capacitor form another current negative feedback part which is disposed opposite to a resonator. Thus, the VCO operates differentially.

In the oscillator of the differential current negative feedback VCO, emitter noise currents generated by base noise voltages of Q1 and Q2 induced by low- and high-frequency noise sources in the bases of Q1 and Q2 are sampled by emitter resistors, amplified through bases of Q3 and Q4, and thus return to the bases of the Q1 and Q2 and suppress the base noise voltages. Measurement of the phase noise of the differential current negative feedback VCO reveals a phase noise reduction of approximately 25 dB compared to a conventional differential VCO.

13 Claims, 8 Drawing Sheets

U.S. PATENT DOCUMENTS

| | | |
|---|---|---|
| 5,379,003 A | 1/1995 | Bizen |
| 6,198,359 B1 | 3/2001 | Wichern |
| 6,466,099 B2 | 10/2002 | Festag |
| 2002/0113659 A1 | 8/2002 | Scoggins |

FOREIGN PATENT DOCUMENTS

| | | |
|---|---|---|
| KR | 1020030026123 | 3/2003 |
| KR | 1020030070576 | 8/2003 |

OTHER PUBLICATIONS

Ulrich L. Rohde; Nonlinear Effects In Oscillators and Synthesizers (Invited); 2001 IEEE MTT-S Digest; pp. 689-692.

Kyung-Whan Yeom; "Design and fabrication of the surface mountable VCO operating at 3V for PCS handset"; Korean Institute of Communication and Sciences, '96-3 vol. 21, No. 3; pp. 784-794.

\* cited by examiner

LOW PHASE NOISE DIFFERENTIAL LC TANK VCO WITH CURRENT NEGATIVE FEEDBACK

CROSS-REFERENCE TO RELATED APPLICATION

This application claims priority to and the benefit of Korean Patent Application No. 2005-119425, filed Dec. 8, 2005, and 2006-71106, filed Jul. 28, 2006, the disclosure of which is incorporated herein by reference in its entirety.

BACKGROUND

1. Field of the Invention

The present invention relates to a low phase noise differential LC tank voltage controlled oscillator (VCO) with current negative feedback, in which a phase noise characteristic is improved by mounting a current negative feedback circuit on a typical differential emitter-degeneration VCO.

2. Discussion of Related Art

A conventional differential LC tank cross-coupled pair VCO when combined with a phase-locked loop constitutes a frequency synthesizer, and is widely employed in a wireless transceiver integrated circuit. The differential LC tank cross-coupled pair VCO has an excellent noise characteristic compared with other oscillators due to a filtering function of an LC tank 100, however further reduction of noise is required.

Accordingly, the differential LC tank VCO increases a Q factor of an inductor in the LC tank 100 to reduce phase noise, or uses an LC filter to eliminate noise from a current source. Since phase noise in the differential LC tank VCO is caused largely by up-conversion of 1/f noise and thermal noise of a cross-coupled pair, efforts have been made to thoroughly reduce the influence of 1/f noise and thermal noise using a low-frequency negative feedback circuit. Recently, a differential emitter-degeneration cross-coupled pair VCO has been developed in order to upwardly adjust an oscillation frequency of the conventional differential LC tank cross-coupled pair VCO, reduce phase noise, and expand a frequency modulation range.

FIG. 1 illustrates a conventional differential capacitive-degeneration LC tank VCO 10. As illustrated in the VCO circuit 10 of FIG. 1, when a resistor 121 or a capacitor $C_P$ 125 is connected to an emitter of an oscillation transistor 111, a negative resistance range moves to a higher frequency. Accordingly, at the higher frequency, the VCO oscillates with larger amplitude and has an expanded frequency modulation range and reduced phase noise. Input impedance in a cross-coupled pair of the capacitive-degeneration LC tank VCO 10 is given by Equation 1.

$$Z_{in} = -2\left(Z_E + \frac{1}{g_m} + s\frac{C_\pi r_b}{g_m}\right) \qquad \text{[Equation 1]}$$

In Equation 1, $Z_E = R_E // (1/sC_P)$, $C_P$ denotes base-emitter capacitance, $r_b$ denotes base resistance, and $g_m$ denotes transconductance. As shown in Equation 1, negative resistance of the input impedance seen from collector nodes of oscillation transistors 111 and 112 is increased by parallel connection of emitter resistors 121 and 122 and capacitors 125 and 126. And, the third term in Equation 1 has an inductance character, which shows that the frequency modulation range is also widened.

In the capacitive-degeneration LC tank VCO 10 of FIG. 1, $V_{nf}$ denotes a low-frequency noise source corresponding to 1/f noise and thermal noise in a base of each transistor, $V_{nbe}$ denotes base-emitter voltage of a cross-coupled pair 111 and 112 induced by the low-frequency noise source, $I_{ntail}$ denotes tail current noise, $I_E$ denotes emitter current, $\Delta I_E$ denotes a range of fluctuation in the emitter current due to low-frequency noise, $V_{am}$ denotes a low-frequency amplitude modulation (AM) signal of oscillation frequency, that is, carrier frequency, due to low-frequency noise, $V_{cm}$ denotes a common-mode level, and $\Delta V_{cm}$ denotes a range of fluctuation in the common-mode level due to low-frequency noise.

Elements affecting phase noise in the differential LC tank VCO 10 of FIG. 1 are the Q-factor of an inductor, low-frequency noise of a cross-coupled pair transistor, and low- and high-frequency noise of current source transistors 127 and 128. In the differential LC tank VCO 10 of FIG. 1, the base-emitter voltage $V_{nbe}$ is induced by the low-frequency noise source $V_{nf}$ at bases of the oscillation transistors 111 and 112, and the emitter current changes by as much as $\Delta I_E$ due to the base-emitter voltage $V_{nbe}$. After the low-frequency amplitude modulation of a carrier signal by the change in emitter current, a mean capacitance value of a varactor changes due to the amplitude modulation signal $V_{am}$, and the carrier frequency fluctuates, thereby generating jitter, which contributes to phase noise.

Also, the $I_E$ is modulated by low-frequency noise of tail current, thereby causing $V_{cm}$ to fluctuate by as much as $\Delta V_{cm}$. This fluctuation in turn causes variation in varactor bias voltage, which causes the carrier signal to fluctuate, thereby generating jitter, which contributes to phase noise.

Also, in the differential LC tank VCO 10 of FIG. 1, the base-emitter voltage $V_{nbe}$ of the oscillation transistors 111 and 112 induced by the low-frequency noise source and the carrier signal get mixed due to nonlinear characteristics of the oscillation transistors 111 and 112, and thus the mixed noise contributes to noise around the carrier signal.

In the differential LC tank VCO 10 of FIG. 1, low- and high-frequency noise of the tail current induced by low-frequency noise sources and the carrier signal become mixed due to nonlinear characteristics of the oscillation transistors 111 and 112, and the mixed noise contributes to noise around the carrier signal.

SUMMARY OF THE INVENTION

The present invention is directed to providing a differential current negative feedback voltage controlled oscillator (VCO) that has an excellent phase noise characteristic.

The present invention is also directed to providing a differential current negative feedback VCO enabling low- and high-frequency noise of an LC tank VCO to be basically cut off. Accordingly, phase noise of the VCO due to low- and high-frequency noise from oscillation and current source transistors of a differential capacitive-degeneration LC tank VCO can be substantially eliminated.

An aspect of the present invention provides a differential current negative feedback VCO comprising: an LC tank resonator for providing inductance and capacitance between a power voltage terminal and a first node, and between the power voltage terminal and a second node; first and second oscillation transistors connected to the first and second nodes, respectively, and cross-coupled between a collector and a base; first and second emitter driving parts functioning as current sources for driving each of the oscillation transistors; and a current negative feedback part including first and second negative feedback transistors receiving as input at bases thereof output from emitters of the oscillation transistors, and offsetting effects of noise components applied to bases of the oscillation transistors and amplified.

The present invention suggests a differential LC tank VCO equipped with a low-frequency negative feedback circuit in order to reduce 1/f noise and thermal noise from a transistor that increase phase noise in the conventional differential LC tank VCO. That is, to solve the problem of phase noise in the conventional differential LC tank VCO, a low-frequency current negative feedback circuit is mounted in a conventional differential capacitive-degeneration LC tank VCO.

BRIEF DESCRIPTION OF THE DRAWINGS

The above and other features and advantages of the present invention will become more apparent to the one of ordinary skill in the art by describing in detail preferred embodiments thereof with reference to the attached drawings in which.

DETAILED DESCRIPTION OF EXEMPLARY EMBODIMENTS

Hereinafter, a differential current negative feedback voltage controlled oscillator (VCO) according to exemplary embodiments of the present invention will be described in detail with reference to the attached drawings.

Figure 2:
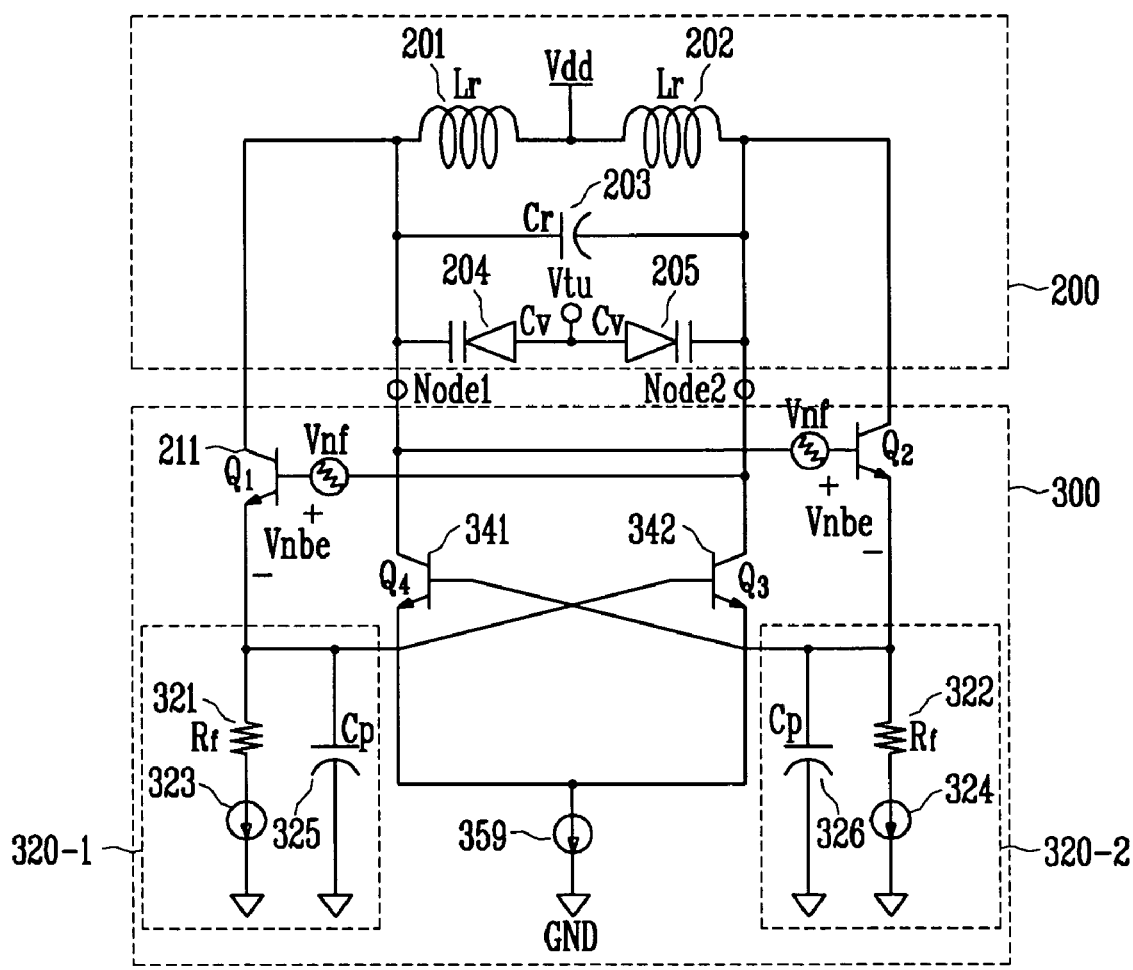
FIG. 2 is a circuit diagram illustrating a differential current negative feedback VCO according to an exemplary embodiment of the present invention.

FIG. 2 illustrates a differential capacitive-degeneration LC tank voltage controlled oscillator (VCO) 20 equipped with a low-frequency current negative feedback circuit according to an exemplary embodiment of the present invention. In an oscillator 200 of the differential current negative feedback LC tank VCO 20, emitter currents of oscillation transistors (amplifiers) Q1 211 and Q2 212 are sampled by emitter-degeneration resistors $R_f$ 321 and 322, and input into bases of negative feedback transistors (amplifiers) Q3 342 and Q4 341 for low frequency, respectively. Because of this procedure, this circuit is called a current-current negative feedback circuit.

The differential current negative feedback LC tank VCO 20 of FIG. 2 comprises an LC tank resonator 200 determining oscillation frequency and filtering noise, and an oscillator 300 connected with the LC tank resonator 200 in parallel so as to generate negative resistance for inducing oscillation. The transistors Q1 211 and Q2 212 form a cross-coupled pair which induces positive feedback together with the emitter-degeneration resistors $R_f$ 321 and 322 and capacitors $C_P$ 325 and 326, thereby generating the negative resistance.

In the oscillator 300 in the differential current negative feedback LC tank VCO 20 of FIG. 2, the oscillation transistor Q1 211, a low-frequency negative feedback transistor Q3 342, the emitter-degeneration resistor $R_f$ 321, and the emitter-degeneration capacitor $C_P$ 325 are formed in a loop, thereby forming current-current negative feedback. And, on the opposite side of the LC tank resonator 200, the oscillation transistor Q2 212, a low-frequency negative feedback transistor Q4 341, the emitter-degeneration resistor $R_f$ 322, and the emitter-degeneration capacitor $C_P$ 326 form a current-current negative feedback part, thereby operating differentially.

Input impedance of the oscillator 300 of the differential current negative feedback LC tank VCO 20, that is, input impedance of the oscillator 300 seen from collector nodes of the oscillation transistors Q1 211 and Q2 212 (node 1 and node 2), may, with reference to Equation 1, be simply given by the following Equation 2.

$$Z_{in} = -2\left((Z_E // Z_{FIN})\frac{1}{g_m} + s\frac{C_\pi r_b}{g_m}\right) \quad \text{[Equation 2]}$$

In Equation 2, $Z_E = R_E//(1/sC_P)$, $Z_{FIN}$ denotes input impedance of a negative feedback transistor, $C_P$ denotes base-emitter capacitance, $r_b$ denotes base resistance, and $g_m$ denotes transconductance.

In the differential current negative feedback LC tank VCO 20, the resonator 200 of the differential current negative feedback LC tank VCO 20 comprises resonant inductors $L_r$ 201 and 202, a resonant capacitor $C_r$ 203, and varactors $C_v$ 204 and 205, and oscillation frequency is approximately determined by the resonator 200. The oscillation frequency of the differential current negative feedback LC tank VCO 20 is precisely determined by the inductance and capacitance of the LC tank resonator 200, the emitter-degeneration capacitance $C_P$, and the input capacitances of the low-frequency negative feedback transistors Q3 342 and Q4 341 of the oscillator 300. And, the oscillation frequency $f_O$ may be approximately given by Equation 3.

$$f_o = \frac{1}{2\pi\sqrt{L_r(C_r + C_v + C_p + C_{FIN})}} \quad \text{[Equation 3]}$$

In Equation 3, $L_r$ denotes inductance of each of the resonant inductors 201 and 202, $C_r$ denotes capacitance of the resonance capacitor 203, $C_V$ denotes capacitance of each of the varactors 204 and 205 of the LC resonator, $C_P$ denotes capacitance of the emitter-degeneration capacitor 325 or 326, and $C_{FIN}$ denotes input capacitance of a base input of each of the low-frequency negative feedback transistors Q3 342 and Q4 341 seen from each emitter of Q1 and Q2.

The resonant inductor $L_r$ 201 of the LC tank resonator 200 almost functions as a short circuit at low frequency, so that the oscillation transistors Q1 211 and Q2 212 of the oscillator 300 in the differential current negative feedback LC tank VCO 20 function as emitter-follower amplifiers. Meanwhile, since the resonant inductor $L_r$ 201 of the LC tank resonator 200 functions as high impedance at high frequency, the oscillation transistors Q1 221 and Q2 212 function as emitter-degeneration amplifiers. The low-frequency negative feedback transistors Q3 342 and Q4 341 of the oscillator 300 in the differential current negative feedback LC tank VCO 20 function as common-emitter amplifiers amplifying low frequency, and a high-frequency signal is filtered out by the emitter-degeneration capacitances $C_P$ 325 and 326.

A method for high-frequency oscillation and a low-frequency feedback characteristic of the differential current negative feedback LC tank VCO 20 are described above. A noise suppression characteristic of the differential current negative feedback LC tank VCO 20 will be described below.

In the oscillator 300 of the differential current negative feedback LC tank VCO 20, each of emitter currents of the oscillation transistors Q1 211 and Q2 212 is sampled by each of the emitter-degeneration resistors $R_f$ 321 and 322 and then input to the base of each of the low-frequency negative feedback transistors Q3 342 and Q4 341, respectively. In the oscillator 300 of the differential current negative feedback LC tank VCO 20, emitter noise currents generated by base noise voltages of the oscillation transistors Q1 211 and Q2 212 induced by the low- and high-frequency noise sources $V_{nf}$ existing at the bases of the oscillation transistors Q1 211 and Q2 212 are sampled by each of the emitter-degeneration resistors $R_f$ 321 and 322, amplified through bases of the high-frequency negative feedback transistors Q3 342 and Q4 341, and returned to the bases of the high-frequency oscillation transistors Q1 211 and Q2 212. Thus, base-emitter noise voltages $V_{nbe}$ of the high-frequency oscillation transistors Q1 211 and Q2 212 are suppressed by as much as the returned voltages.

Figure 3:
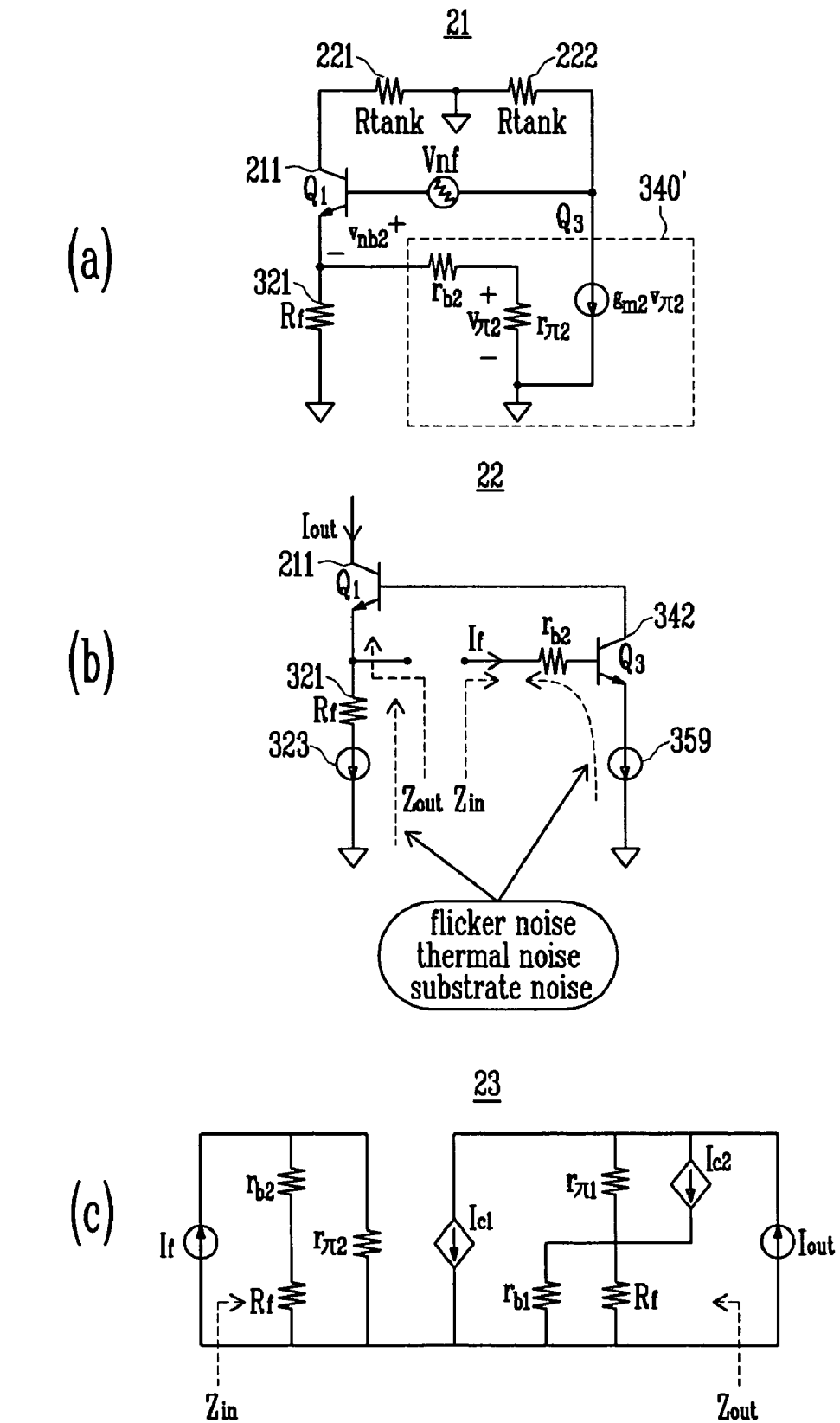
FIG. 3A is a circuit diagram illustrating a low-frequency equivalent circuit of the current negative feedback circuit of FIG. 2.
FIG. 3B is a circuit diagram representing noise entering into emitters of oscillation transistors Q1 and Q2 in the current negative feedback circuit of FIG. 2, for analyzing impedance seen from outside looking into emitters of the oscillation transistors Q1 and Q2.
FIG. 3C is a circuit diagram representing a low-frequency equivalent circuit for inducing input impedance of emitters of the current negative feedback circuit of FIG. 2.

The base-emitter voltage $V_{nbe}$ may be represented as Equations 4 and 5 from a low-frequency equivalent circuit model of FIG. 3A. In the low-frequency equivalent circuit 21 of FIG. 3A, $R_{tank}$ 221 denotes a resistance component of the LC tank resonator 200, and a block 340' denotes a low-frequency equivalent circuit for the negative feedback transistor Q3 342.

$$V_{nbe} = \frac{V_{nf}}{1 + A_{v1}} \quad \text{[Equation 4]}$$

$$V_{nbe} = \frac{V_{nf}}{1 + A_{v1} + A_{v1}A_{v2}\frac{r_{\pi 2}}{r_{b2} + r_{\pi 2}}} \quad \text{[Equation 5]}$$

In Equations 4 and 5, $A_{v1}$ denotes voltage gain of the oscillation transistors Q1 221 and Q2 212, $A_{v2}$ denotes voltage gain of the negative feedback transistors Q3 342 and Q4 341, $r_{b2}$ denotes base distributed resistance of the negative feedback transistors Q3 342 and Q4 341, and $r_{p2}$ denotes forward bias resistance between base-emitters of the negative feedback transistors Q3 342 and Q4 341.

Equation 4 represents reduction of low-frequency noise by negative feedback of the emitter-degeneration resistor $R_f$ 321, and Equation 5 represents reduction of low-frequency noise by a current negative feedback part composed of the emitter-degeneration resistor $R_f$ 321, the oscillation transistor Q1 211 and the negative feedback transistor Q3 342. In Equation 5, the oscillation transistor Q1 211 is an emitter-follower, so the voltage gain Av is almost 1, and the negative feedback transistor Q3 342 functions as a common-emitter amplifier, so the voltage gain $A_{v2}$ depends on a method of constituting a load resistor and a load resistor value. According to Equation 5, a degree of low-frequency noise suppression is determined by the voltage gain $A_{v2}$. If the voltage gain $A_{v2}$ is infinite, the low-frequency noise voltage $V_{nbe}$ may be completely suppressed.

FIG. 3B illustrates how to suppress flicker noise (1/f noise), thermal noise of the tail current source 323, and silicon substrate noise from ground, by the current-current negative feedback part 22 in the oscillator 300 of the differential current negative feedback LC tank VCO 20, and FIG. 3C illustrates a low-frequency equivalent circuit 23 for the current-current negative feedback part 22 of FIG. 3B. In the current-current negative feedback part 22 of FIG. 3B, the flicker noise, thermal noise of the tail current source 323, silicon substrate noise from ground, enter into emitters of the oscillation transistor Q1 211 and the negative feedback transistor Q3 342, and is injected into the LC tank resonator 200, thereby contributing to phase noise or being converted into phase noise centered around a carrier frequency due to a nonlinear mixing effect of the oscillation transistor Q1 211. However, since impedance $Z_{out}$ of the emitter of the oscillation transistor Q1 211 seen from the emitter node of Q1 is increased as much as loop gain T of the current-current negative feedback part 22, the flicker noise, thermal noise, silicon substrate noise, etc. entering into the emitter of the oscillation transistor Q1 211 in the current-current negative feedback part 22 are attenuated. This principle may be given by the following Equations 6 and 7 derived from the low-frequency equivalent circuit 23 of the current-current negative feedback part 22 of FIG. 3C.

$$Z_{out} = \left(\frac{\beta_o r_{b1}}{r_{b1} + r_{\pi 1} + R_f}\right)(1 + T) \quad \text{[Equation 6]}$$

$$Z_{in} = \frac{r_{\pi 2}}{1 + T} \quad \text{[Equation 7]}$$

In Equations 6 and 7, $T=(\beta_o R_f/r_{b2})$ denotes loop gain, and $\beta_O$ 15 denotes current gain.

In Equation 6, the impedance $Z_{out}$ looking into the emitter of the oscillation transistor Q1 211 is increased as much as the loop gain T, and thus all kinds of noise entering into the emitter of the oscillation transistor Q1 211 are attenuated.

FIGS. 4 to 7 illustrate various modified exemplary embodiments in which at least one of the elements of the VCO illustrated in FIG. 2 is replaced with a different element while keeping with the sprit of the present invention.

As described above, the VCO of FIG. 2 comprises: the LC tank resonator 200 connected between a power voltage terminal and the first node and between the power voltage terminal and the second node; the first and second oscillation transistors 211 and 212 connected to the respective first and second nodes; the first and second emitter driving parts 320-1 and 320-2 for driving the respective oscillation transistors; and the first and second negative feedback transistors 341 and 342 inputting the emitter outputs of the oscillation transistors to respective bases.

First, possible substitutions for elements of FIG. 2 will be described, and some among many possible VCO embodiments obtained by substituting at least one of the elements of FIG. 2 will be selected and described with reference to the drawings.

The first and second emitter driving parts 320-1 and 320-2 illustrated in FIG. 2 comprise: the emitter-degeneration resistors 321 and 322 connected at one end to emitters of the oscillation transistors 211 and 212; the emitter current sources 323 and 324 connected between the other end of the emitter-degeneration resistors 321 and 322 and ground; and the emitter-degeneration capacitors 325 and 326 connected between emitters of the oscillation transistors 211 and 212 and ground.

Figure 4:
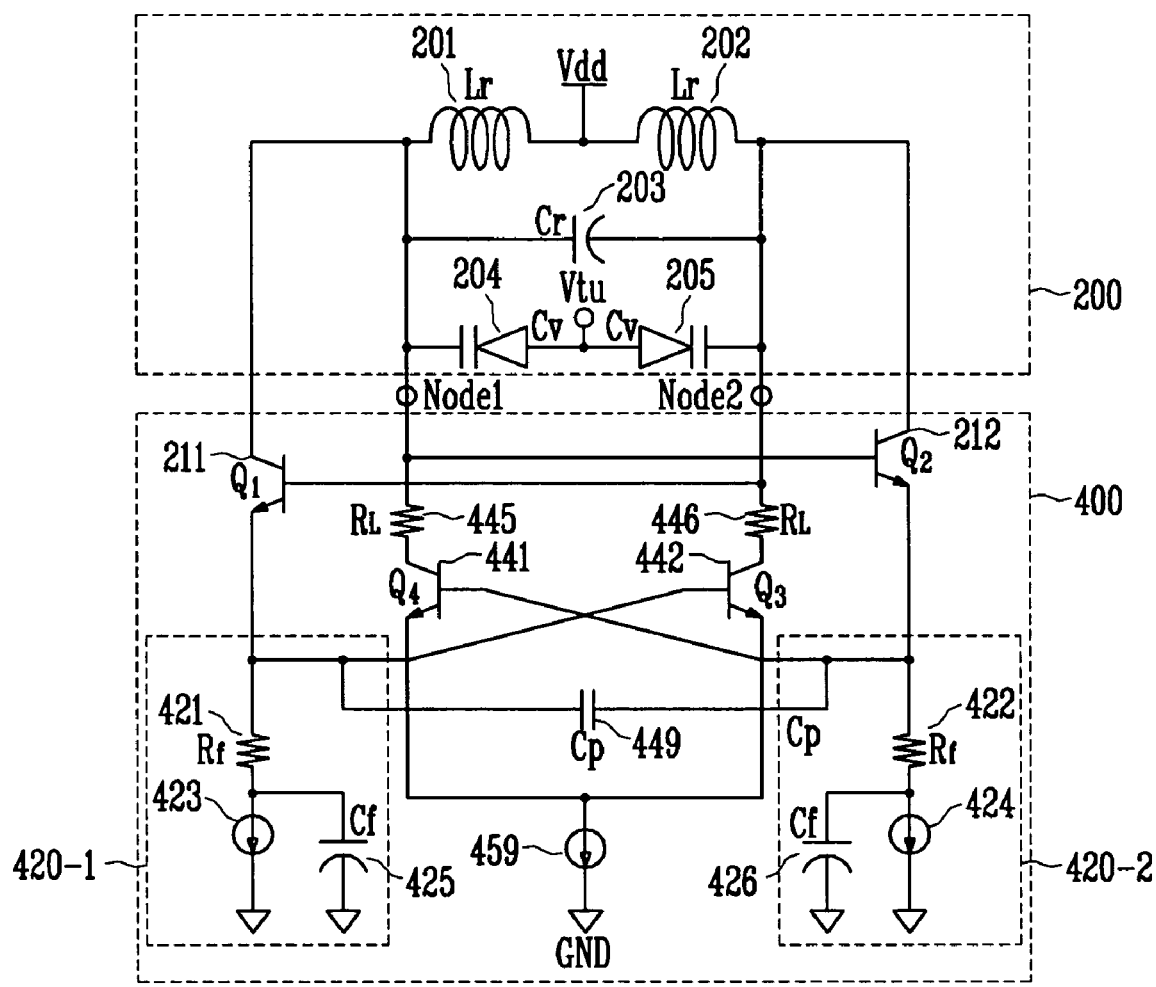
FIG. 4 is a circuit diagram illustrating a differential current negative feedback VCO according to another embodiment of the present invention.

According to another embodiment, illustrated in FIG. 4, the first and second emitter driving parts may be modified to comprise: emitter-degeneration resistors 421 and 422 connected at one end to emitters of the oscillation transistors 211 and 212; emitter current sources 423 and 424 connected between the other end of the emitter-degeneration resistors 421 and 422 and ground; and current source capacitors 425 and 426 connected with the emitter current sources 423 and 424 in parallel. The modified first and second emitter driving parts may be included in structures illustrated in FIGS. 5 and 6.

Figure 7:
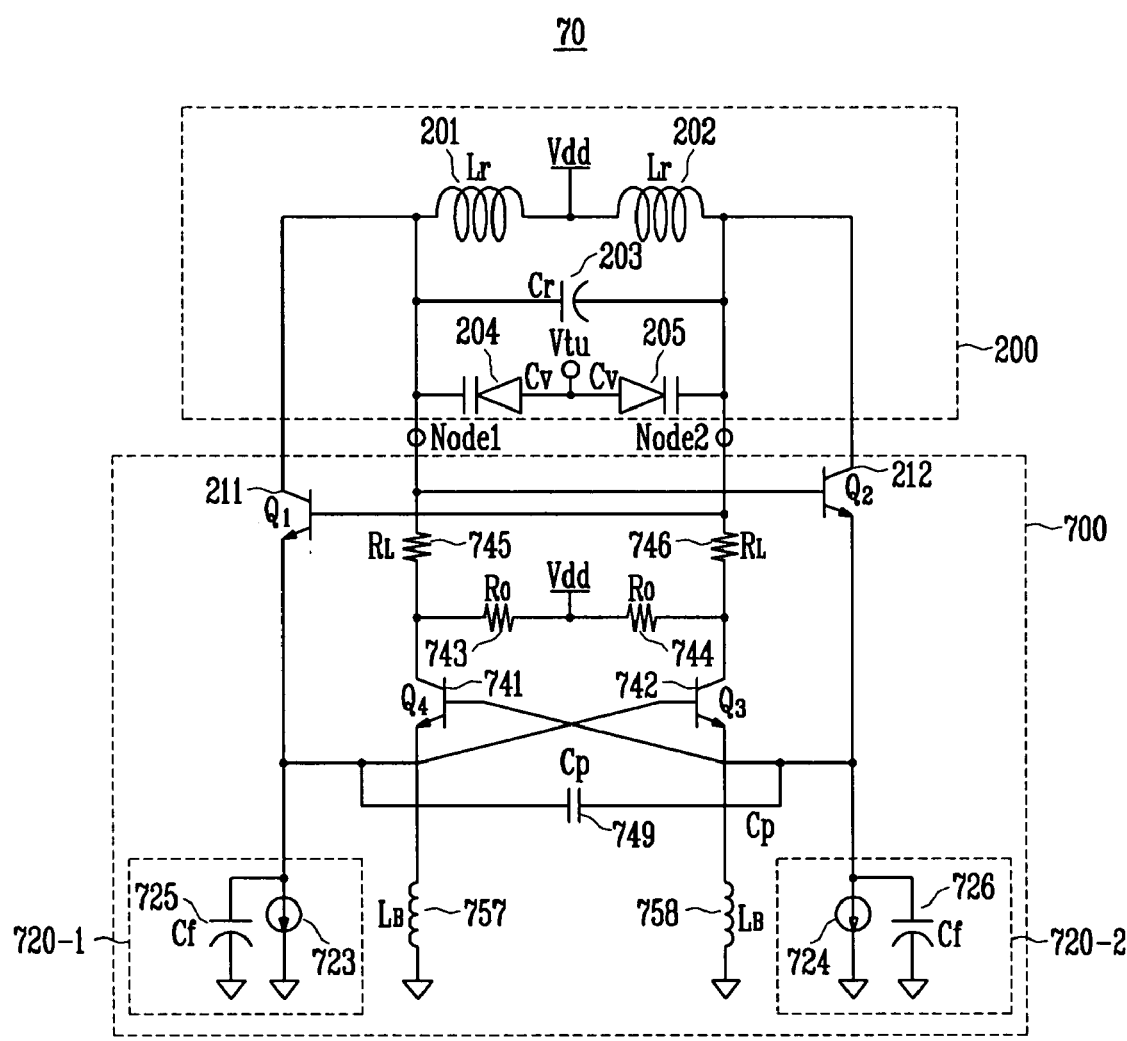
FIG. 7 is a circuit diagram illustrating a differential current negative feedback VCO according to yet another embodiment of the present invention.

According to still another embodiment, illustrated in FIG. 7, the first and second emitter driving parts may be modified to comprise: emitter current sources 723 and 724 connected between emitters of the oscillation transistors 211 and 212 and ground; and current source capacitors 725 and 726 connected with the emitter current sources 723 and 724 in parallel.

The current negative feedback part 320-1 illustrated in FIG. 2 comprises: the first negative feedback transistor 341 connected at its collector to the first node Node1, and at its base to the emitter of the second cross-coupled transistor 212; the second negative feedback transistor 342 connected at its collector to the second node Node2, and at its base to the emitter of the first cross-coupled transistor 211; and the negative feedback current source 359, connected between emitters of the first and second negative feedback transistors 341 and 342 and ground, for driving the first and second negative feedback transistors 341 and 342.

According to another embodiment, illustrated in FIG. 4, the current negative feedback part may be modified to comprise: a first load resistor 445 connected at one end to the first node node 1; a second load resistor 446 connected at one end to the second node Node2; a first negative feedback transistor 441 whose collector is connected to the other end of the first load resistor 445 and whose base is connected with the emitter of second cross-coupled transistors 212; a second negative feedback transistor 442 whose collector is connected to the other end of the second load resistor 446 and whose base is connected to the emitter of a first cross-coupled transistor 211; and a negative feedback current source 459, connected between emitters of the first and second negative feedback transistors 441 and 442 and ground, for driving the first and second negative feedback transistors 441 and 442. The substituted current negative feedback part is included in structures illustrated in FIGS. 5 to 7.

Figure 5:
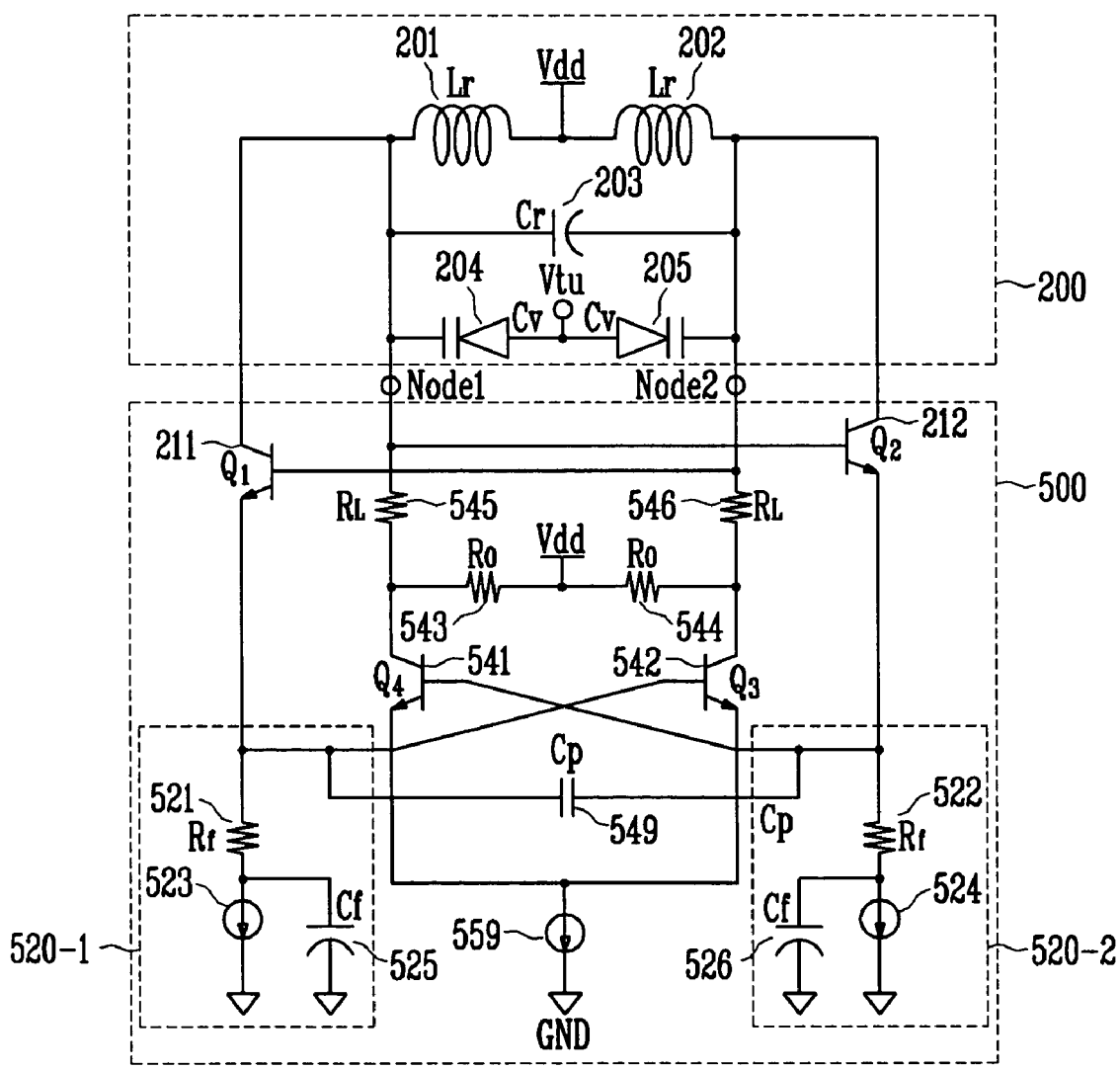
FIG. 5 is a circuit diagram illustrating a differential current negative feedback VCO according to still another embodiment of the present invention.
Figure 6:
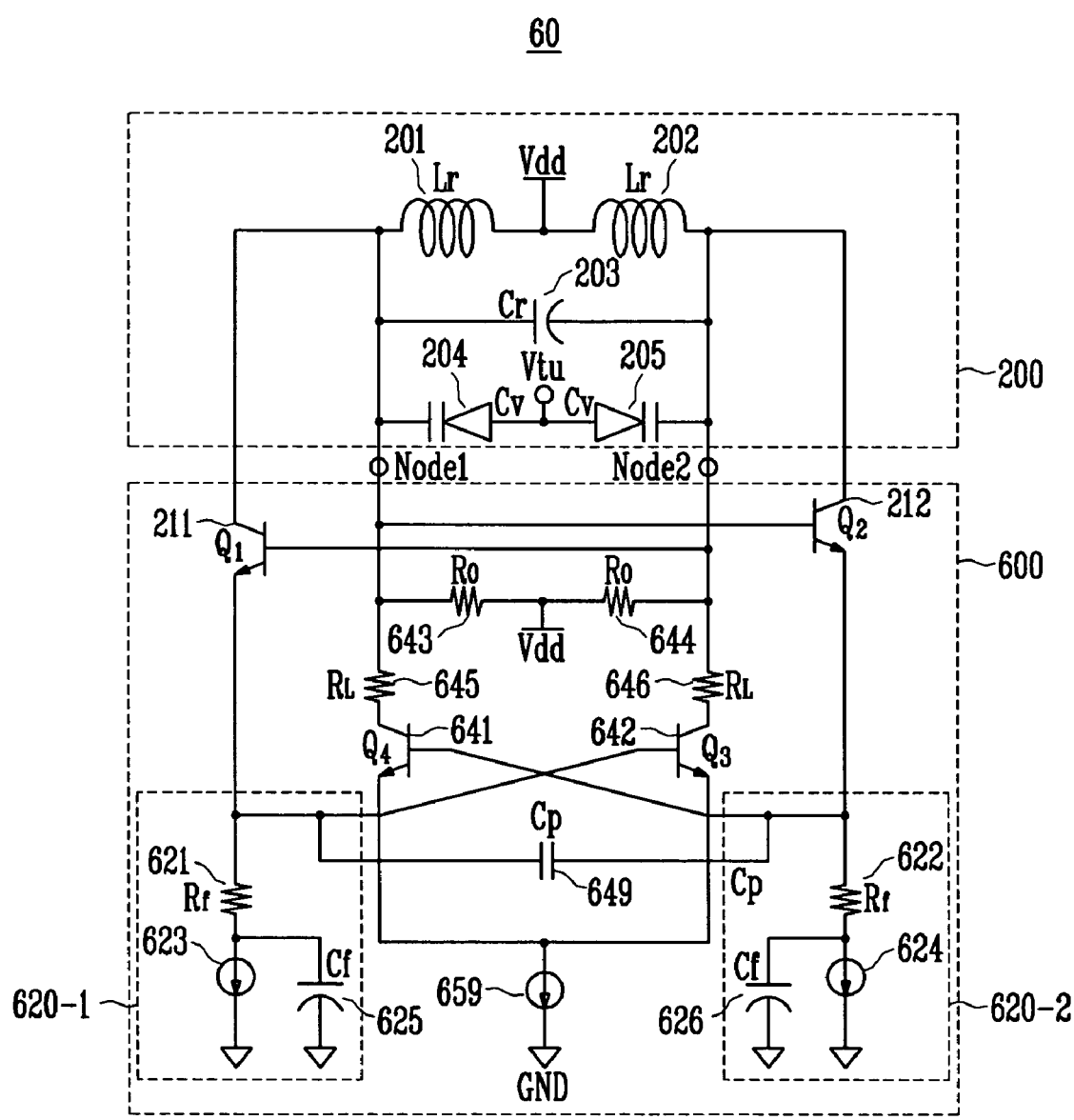
FIG. 6 is a circuit diagram illustrating a differential current negative feedback VCO according to yet another embodiment of the present invention.

Also, the current negative feedback part illustrated in FIG. 4 may further include a parallel capacitor 449 between the bases of the first and second negative feedback transistors 441 and 442, and still be applied to the structures of the following FIGS. 5 to 7.

The current negative feedback part illustrated in FIG. 5 may further include: a first low-frequency gain boosting resistor 543 connected between the power voltage terminal and a collector of a first negative feedback transistor 541; and a second low-frequency gain boosting resistor 544 connected between the power voltage terminal and a collector of a second negative feedback transistor 542.

The current negative feedback part illustrated in FIG. 6 may further include: a first low-frequency gain boosting resistor 643 connected between the power voltage terminal and a first node Node1; and a second low-frequency gain boosting resistor 644 connected between the power voltage terminal and a second node Node2.

The current negative feedback part may be substituted with one comprising: first and second negative feedback transistors 741 and 742 having the structure illustrated in FIG. 2; a first boosting inductor 757 connected at one end to an emitter of the first negative feedback transistor 741, and at the other end to ground; and a second boosting inductor 758 connected at one end to an emitter of the second negative feedback transistor 742, and at the other end to ground. The substitute current negative feedback part is illustrated in FIG. 7.

The LC tank resonator 200 illustrated in FIG. 2 comprises: the first resonant inductor 201 connected between the power voltage terminal and the first node Node1, and between the power voltage terminal and the second node Node2; the second resonant inductor 202 connected between the power voltage terminal and the second node node 2; and the resonant capacitor 203 connected between the first and second nodes Node 1 and Node2.

Figure 1:
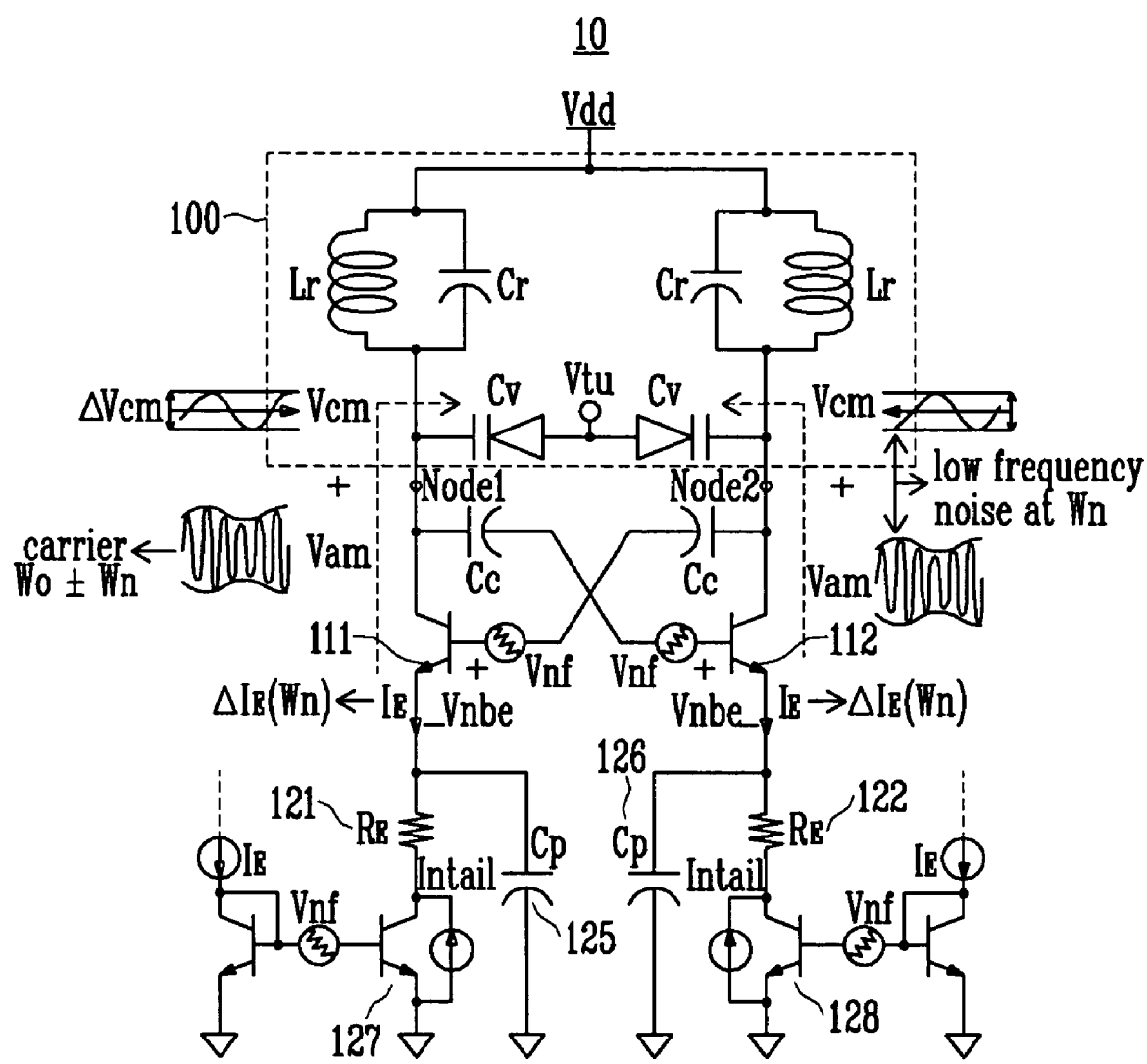
FIG. 1 is a circuit diagram illustrating a circuit of a conventional differential capacitor feedback or capacitive degeneration cross-coupled pair VCO, low- and high-frequency noise sources, and effects of noise on the voltage controlled oscillator (VCO)

According to another embodiment, the LC tank resonator may have a first resonant capacitor connected with the first resonant inductor 201 in parallel and a second resonant capacitor connected with the second resonant inductor 202 in parallel instead of the resonant capacitor 203 in FIG. 2, which is the same configuration as the conventional LC tank resonator of FIG. 1. Also, the LC tank resonator 200 may further include varactors 204 and 205 as in FIG. 2 for fine tuning of the resonant capacitor.

FIG. 4 illustrates a modified structure of a differential current negative feedback LC tank VCO, the structure having the same operation characteristics as the differential current negative feedback LC tank VCO of FIG. 2 and increasing low-frequency gain of the negative feedback transistors Q3 442 and Q4 441. The operation characteristic of the modified differential current negative feedback LC tank VCO 40 of FIG. 4 will now be described.

In the modified differential current negative feedback LC tank VCO 40, oscillation transistors Q1 221 and Q2 212 of an oscillator 400 function as an emitter follower amplifier at low frequency because the inductor $L_r$ 201 of the LC tank resonator 200 acts almost as a short circuit. But, they function as emitter-degeneration amplifiers at high frequency because the inductor $L_r$ 201 of the LC tank resonator 200 acts as high impedance.

The transistors Q1 221 and Q2 212 in the oscillator 400 of the modified differential current negative feedback LC tank VCO 40 form a cross-coupled pair, and positive feedback is induced by the cross-coupled pair Q1 and Q2, the emitter-degeneration resistor $R_r$ 421 and the capacitor $C_P$ 425, and thus negative resistance is generated.

In the oscillator 400 of the modified differential current negative feedback LC tank VCO 40 of FIG. 4, a loop is formed with the oscillation transistor Q1 211, the low-frequency negative feedback transistor Q3 442, the emitter-degeneration resistor $R_r$ 421 and the emitter-degeneration capacitor $C_p$ 449 so as to carry out current-current negative feedback. And, on the opposite side of the LC tank resonator 220, the oscillation transistor Q2 212, the low-frequency negative feedback transistor Q4 441, the emitter-degeneration resistor $R_f$ 422, and the emitter-degeneration capacitor $C_p$ 449 form the current-current negative feedback so as to operate differentially.

In the oscillator 400 of the modified differential current negative feedback LC tank VCO 40, the emitter-degeneration capacitor $C_p$ 449 has the same function in the circuit as the emitter-degeneration capacitors $C_p$ 216 and 217 of the differential current negative feedback LC tank VCO 20 of FIG. 2. In the modified differential current negative feedback LC tank VCO 40 of FIG. 4, the resistors $R_L$ 445 and 446 are for increasing gains $A_{v2}$ of the negative feedback transistors Q3 442 and Q4 441 and repressing high-frequency negative feedback, and the capacitors $C_r$ 425 and 426 filter low- and high-frequency noise of current sources 426 and 424 connected to the emitter-degeneration resistors $R_f$ 421 and 422 of the oscillation transistors Q1 221 and Q2 212, respectively.

FIGS. 5 and 6 illustrate another modified structure of the differential current negative feedback LC tank VCO, which has the same operation characteristics as the differential current negative feedback LC tank VCO of FIG. 2 and increases low-frequency gain of the negative feedback transistors Q3 213 and Q4 214. In the modified differential current negative feedback LC tank VCOs 50 and 60, resistors $R_o$ 543, 544, 643 and 644 increase gains $A_{v2}$ of negative feedback transistors Q3 and Q4 542, 642, 541 and 641 together with resistors $R_L$ 545, 546, 645 and 646, and suppress high-frequency negative feedback.

FIG. 7 illustrates still another modified structure of the differential current negative feedback LC tank VCO, which has the same operation characteristics as the differential current negative feedback LC tank VCO of FIG. 2 and increases low-frequency gain of the negative feedback transistors Q3 742 and Q4 741 and high-frequency oscillation amplitude. In the modified differential current negative feedback LC tank VCO 70, resistors $R_o$ 743 and 744 increase gains $A_{v2}$ of the negative feedback transistors Q3 742 and Q4 741 together with resistors $R_L$ 745 and 746, and suppress high-frequency negative feedback.

In the modified differential current negative feedback LC tank VCO 70, boosting inductors $L_B$ 757 and 758 are connected to emitters of the negative feedback transistors Q3 742 and Q4 741, respectively, and thereby a current negative feedback part causes negative feedback at low frequency and positive feedback at high frequency. In the modified differential current negative feedback LC tank VCO 70 of FIG. 7, voltage at each of the boosting inductors $L_B$ 757 and 758 forms almost the same phase as base and collector voltages of each of the negative feedback transistors Q3 742 and Q4 741 at high frequency, and thus rapid transient response and large oscillation amplitude are obtained. In the modified differential current negative feedback LC tank VCO 70 of FIG. 7, the emitter-degeneration resistor $R_f$ of each of oscillation transistors Q1 221 and Q2 212 is eliminated and, instead, an output resistor (not illustrated) of a tail current source performs a similar function. Also, even if the modified differential current negative feedback LC tank VCO 70 uses resistors instead of the boosting inductors $L_B$ 757 and 758, the resistors function similar to the boosting inductors.

Figure 8:
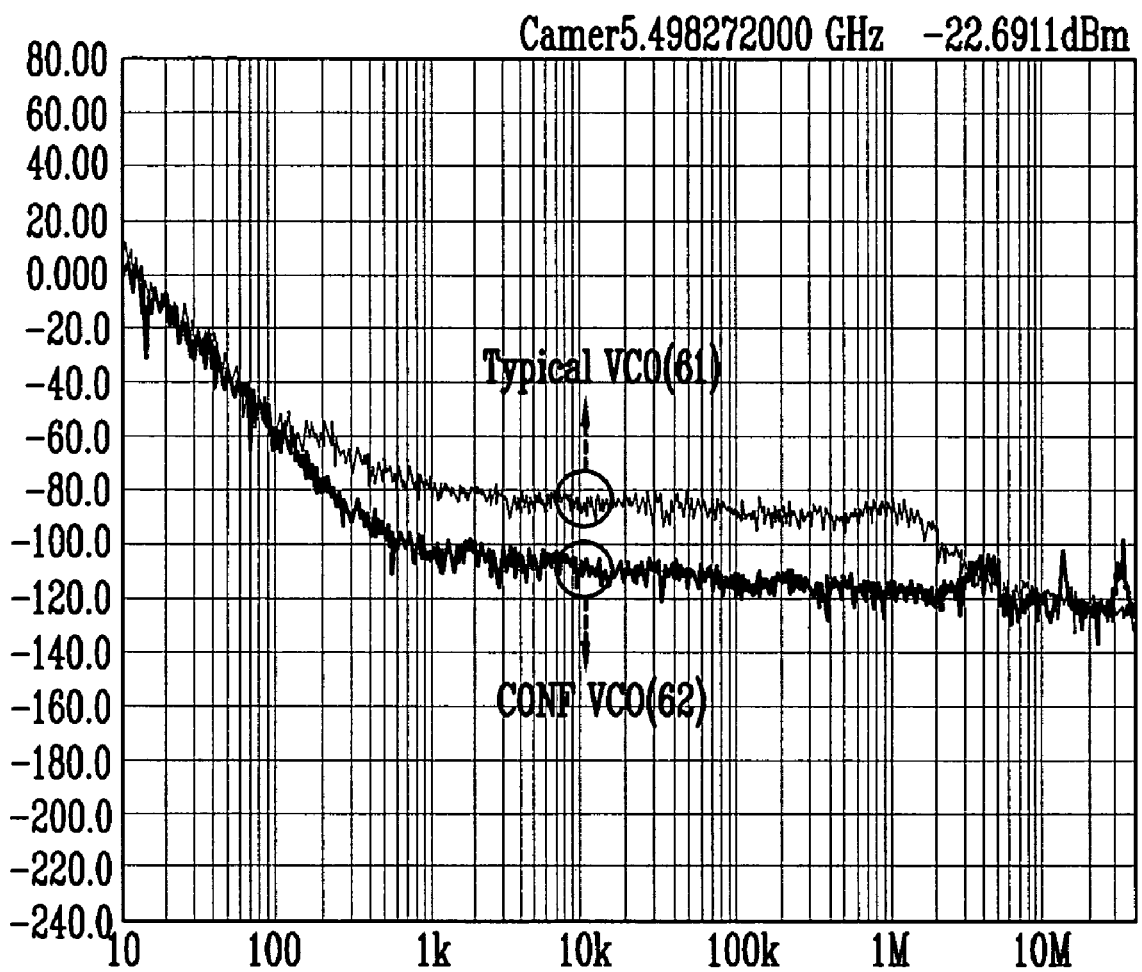
FIG. 8 is a graph comparing phase noise measured from a conventional differential VCO and a differential current negative feedback VCO of the present invention.

FIG. 8 is a graph comparing phase noise measured from the conventional differential emitter-degeneration VCO 10 of FIG. 1 and the differential current negative feedback LC tank VCO 20 of FIG. 2 according to the present invention. As shown in FIG. 8, phase noise of the differential current negative feedback LC tank VCO 20 in FIG. 2 was about 25 dB lower than the phase noise 61 measured in the conventional differential emitter-degeneration VCO 10 at offset frequency of 10 kHz. Both VCOs produced an oscillation frequency of about 5.5 GHz. While the phase noise 61 of the conventional differential emitter-degeneration VCO 10 was −85 dBc/Hz, the phase noise of the differential current negative feedback LC tank VCO 20 in the present invention was −110 dBc/Hz.

A low phase noise differential LC tank VCO with current negative feedback according to the present invention has an improved phase noise characteristic.

That is, a current negative feedback circuit is mounted in the conventional differential emitter-degeneration VCO so as to suppress low- and high-frequency noise generated from a cross-coupled pair and a tail current source, and thus phase noise of the differential VCO is reduced.

And, in the differential current negative feedback LC tank VCO, a boosting inductor is connected to an emitter of the negative feedback transistor, thereby offsetting negative feedback at high frequency and inducing positive feedback.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A voltage controlled oscillator (VCO), comprising:
   an LC tank resonator for providing inductance and capacitance between a power voltage terminal and a first node, and between the power voltage terminal and a second node;
   first and second oscillation transistors connected to the first and second nodes, respectively, and cross-coupled between a collector and a base;
   first and second emitter driving parts functioning as current sources for driving each of the oscillation transistors; and
   a current negative feedback part including first and second negative feedback transistors receiving as input at bases thereof output from emitters of the oscillation transistors, and offsetting effects of noise components applied to bases of the oscillation transistors and amplified.

2. The VCO according to claim 1, wherein the current negative feedback part has one end connected to emitters of the first and second negative feedback transistors, and further comprises a negative feedback current source for driving the first and second negative feedback transistors.

3. The VCO according to claim 1, wherein the current negative feedback part further comprises:
   a first negative feedback inductor in which one end is connected to an emitter of the first negative feedback transistor, and the other end is connected to ground; and
   a second negative feedback inductor in which one end is connected to an emitter of the second negative feedback transistor, and the other end is connected to ground.

4. The VCO according to claim 1, wherein the LC tank resonator comprises:
   a first resonant inductor connected between the power voltage terminal and the first node;
   a second resonant inductor connected between the power voltage terminal and the second node; and
   a resonance capacitor connected between the first and second nodes.

5. The VCO according to claim 4, wherein the LC tank resonator further comprises a pair of varactors connected between the first and second nodes and providing additional capacitance according to a control voltage.

6. The VCO according to claim 1, wherein each of the emitter driving parts comprises:

an emitter-degeneration resistor whose one end is connected to an emitter of an oscillation transistor;

an emitter current source connected between the other end of the emitter-degeneration resistor and ground; and an emitter-degeneration capacitor connected between the emitter of the oscillation transistor and ground.

7. The VCO according to claim 1, wherein each of the emitter driving parts comprises:

an emitter-degeneration resistor whose one end is connected to an emitter of an oscillation transistor;

an emitter current source connected between the other end of the emitter-degeneration resistor and ground; and a current source capacitor connected to the emitter current source in parallel.

8. The VCO according to claim 1, wherein the negative feedback transistor has a base connected to an emitter of an oscillation transistor, a collector connected to a base of the other oscillation transistor, and an emitter connected as a current source for driving the transistor.

9. The VCO according to claim 8, wherein the emitters of the first and second negative transistors are connected to each other.

10. The VCO according to claim 1, wherein the current negative feedback part further comprises:

a first load resistor whose one end is connected to the first node and whose other end is connected to the collector of the first negative feedback transistor; and a second load resistor whose one end is connected to the second node and whose other end is connected to the collector of the first negative feedback transistor.

11. The VCO according to claim 10, wherein the current negative feedback part further comprises a cross capacitor connected between the bases of the first and second negative feedback transistors.

12. The VCO according to claim 10, wherein the current negative feedback part comprises:

a first low-frequency gain stimulation resistor whose one end is connected to the power voltage terminal and whose other end is connected to the first node; and a second low-frequency gain stimulation resistor whose one end is connected to the power voltage terminal and whose other end is connected to the second node.

13. The VCO according to claim 10, wherein the current negative feedback part comprises:

a first low-frequency gain stimulation resistor whose one end is connected to the power voltage terminal and whose other end is connected to the collector of the first negative feedback transistor; and a second low-frequency gain stimulation resistor whose one end is connected to the power voltage terminal and whose other end is connected to the collector of the second negative feedback transistor.

* * * * *